United States Patent
Le

(10) Patent No.: US 7,869,181 B2
(45) Date of Patent: *Jan. 11, 2011

(54) FLEX CIRCUIT LIGHTNING PROTECTION APPLIQUE SYSTEM FOR SKIN FASTENERS IN COMPOSITE STRUCTURES

(75) Inventor: Quynhgiao N. Le, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 423 days.

This patent is subject to a terminal disclaimer.

(21) Appl. No.: 11/613,908

(22) Filed: Dec. 20, 2006

(65) Prior Publication Data

US 2007/0230085 A1    Oct. 4, 2007

Related U.S. Application Data

(63) Continuation-in-part of application No. 11/277,888, filed on Mar. 29, 2006, now Pat. No. 7,277,266.

(51) Int. Cl.
| | |
|---|---|
| *H05F 3/00* | (2006.01) |
| *H02H 1/00* | (2006.01) |
| *H02H 1/04* | (2006.01) |
| *H02H 3/22* | (2006.01) |
| *H05F 3/02* | (2006.01) |
| *B60C 19/08* | (2006.01) |

(52) U.S. Cl. ............... 361/218; 361/212; 361/216; 361/217

(58) Field of Classification Search ......... 361/218, 361/212, 216, 217
See application file for complete search history.

(56) References Cited

U.S. PATENT DOCUMENTS

| | | | | |
|---|---|---|---|---|
| 3,982,218 | A | * | 9/1976 | Adler et al. ............... 338/22 R |
| 3,989,984 | A | * | 11/1976 | Amason et al. ............. 361/212 |
| 4,522,889 | A | * | 6/1985 | Ebneth et al. ............... 428/614 |
| 4,912,594 | A | * | 3/1990 | Bannink et al. ............. 361/218 |
| 5,584,450 | A | | 12/1996 | Pisarski |
| 5,970,393 | A | * | 10/1999 | Khorrami et al. ........... 455/129 |
| 6,250,587 | B1 | * | 6/2001 | Schramm et al. ........ 244/134 R |
| 6,475,616 | B1 | * | 11/2002 | Dietz et al. ........... 428/355 AC |
| 6,790,526 | B2 | * | 9/2004 | Vargo et al. ................. 428/343 |
| 2005/0067532 | A1 | * | 3/2005 | Hindel et al. ............ 244/134 D |
| 2005/0126831 | A1 | * | 6/2005 | Richter et al. ............. 178/18.01 |
| 2005/0181203 | A1 | | 8/2005 | Rawlings et al. | |

FOREIGN PATENT DOCUMENTS

| | | |
|---|---|---|
| EP | 1473227 A | 11/2004 |
| GB | 1508758 A | 4/1978 |
| WO | 2004012937 A | 2/2004 |
| WO | WO 2004/106160 A1 | 12/2004 |

* cited by examiner

*Primary Examiner*—Jared Fureman
*Assistant Examiner*—Lucy Thomas
(74) *Attorney, Agent, or Firm*—Felix L. Fischer

(57) ABSTRACT

A lightning protection appliqué incorporates a plurality of conductive plies adhesively affixed to a composite surface, at least a first one of the plies providing conductive characteristics sufficient to divert electrical energy from a lightning strike and at least a second one of the plies comprising operational circuitry. A dielectric ply is fixed to the composite surface over and completely covering at least one metal surface feature between the plurality of conductive plies and the composite surface.

27 Claims, 4 Drawing Sheets

FLEX CIRCUIT LIGHTNING PROTECTION APPLIQUE SYSTEM FOR SKIN FASTENERS IN COMPOSITE STRUCTURES

REFERENCE TO RELATED APPLICATIONS

This application is a continuation-in-part of U.S. patent application Ser. No. 11/277,888 filed on Mar. 29, 2006 now U.S. Pat. No. 7,277,266 entitled Lightning Protection System for Composite Structure having a common assignee with the present application and is related to copending U.S. application Ser. No. 10/941,429 published as U.S. Patent application no. 2005/0181203 A1 entitled Appliqué and having a common assignee with the present application.

BACKGROUND OF THE INVENTION

1. Field of the Invention

This invention relates generally to the field of protecting composite structures from lightning strikes, and more particularly, to an appliqué having multiple conducting layers including one or more layers for protecting composite aircraft from lightning strikes and one or more layers for operational circuit functionality in aircraft systems.

2. Description of the Related Art

Since aluminum and other metals are highly conductive, a transient charge from a lightning striking a metal body discharges into the metal body with current from the discharge being distributed relatively evenly over the body. A typical lightning strike to a metal aircraft causes no or only minor damage to aircraft components. However, carbon fiber composites generally have a higher strength-to-weight ratio than aluminum and are increasingly replacing aluminum structural components.

Unfortunately, typical state of the art composites, such as Carbon Fiber Reinforced Plastic (CFRP), are approximately 2000 times more resistive than aluminum. A lightning strike to unprotected components, embedded in, passing through or attached to the CRFP aircraft skin that is generally 35-40% resin, does not dissipate as readily as in metal. Typically, temperature drives the damage level created by a lightning strike. The discharge current through composite skin resistance dissipates a burst of energy that causes the carbon fibers to become very hot, so much so, that the skin temperature becomes much hotter in a CRFP structure than in a state of the art aluminum skin. A lightning strike that may have little or no effect on an aluminum structure may damage unprotected CFRP components. For adequate lightning protection for a composite wing structure, the exterior CFRP structure must withstand an initial lightning strike of at least one hundred kiloamperes (100 kA) of discharge current without adverse affects or impact to safety-of-flight.

Furthermore, skin fasteners at an exposed surface are most vulnerable to a direct strike and such a strike is most likely to cause sparking at structural joints. Accordingly, composite structure aircraft must have some protection, especially at exposed skin fasteners. However, it is also important that this protection is economically feasible; in its initial application, in its effectiveness for minimizing resulting damage and, in subsequent consequent repair or replacement, both for continued aircraft flightworthiness and to meet economic repair targets. Unfortunately, typical approaches to minimizing the possibility ignition and reducing damage are complicated and difficult to implement in CFRP.

One approach involves selectively integrating metal (e.g., copper foil) into or onto the composite laminate at the fastening areas. However, this approach is often difficult to implement/rework with labor intensive application processes both pre and post-assembly; and, has not consistently exhibited acceptable EME protection. Copper foils, for example, have resulted in wrinkling during lay-up/cure. Drilling the laminate for fastener installation may contaminate the fuel tank with copper. Even with this additional protection, in the absence of other supporting protection (e.g., fastener collar isolation, fillet/cap sealing), the structure may still have a low sparking threshold. In addition to added complexity, integrating a conductive surface protection layer into the composite wing skin may carry with it an unacceptable weight penalty.

Numerous electrical circuits on aircraft and other vehicles require electrical conductors on or near the skin surface for operation such as deicing systems and certain antenna/sensor applications, structure health monitoring systems. Additionally, general electrical wiring for additional circuit elements, while not necessarily required to be on or near the surface require electrical conductors for operation and placement of those conductors is not critical to the operation of the system.

Application of lightning strike protection to composite structures typically requires the addition conductive layers to the surface of the structure. To enhance the usefulness of these conductive layers, incorporation of additional functionality to the layers provides economic and design efficiency benefits.

It is therefore desirable to provide lightning strike protection appliqués for aircraft which incorporate additional conductive layers for operational functionality in electrical system associated with the aircraft.

SUMMARY OF THE INVENTION

The embodiments disclosed herein for the present invention provide a lightning protection appliqué incorporating a plurality of conductive plies adhesively affixed to a composite surface, at least a first one of the plies providing conductive characteristics sufficient to divert electrical energy from a lightning strike and at least a second one of the plies comprising operational circuitry. A dielectric ply is fixed to the composite surface over and completely covering at least one metal surface feature between the plurality of conductive plies and the composite surface.

In exemplary embodiments the operational circuitry comprises heater elements for deicing, antenna/sensor elements or health monitoring circuitry.

BRIEF DESCRIPTION OF THE DRAWINGS

These and other features and advantages of the present invention will be better understood for exemplary embodiments by reference to the following detailed description when considered in connection with the accompanying drawings wherein.

DETAILED DESCRIPTION OF THE INVENTION

Figure 1:
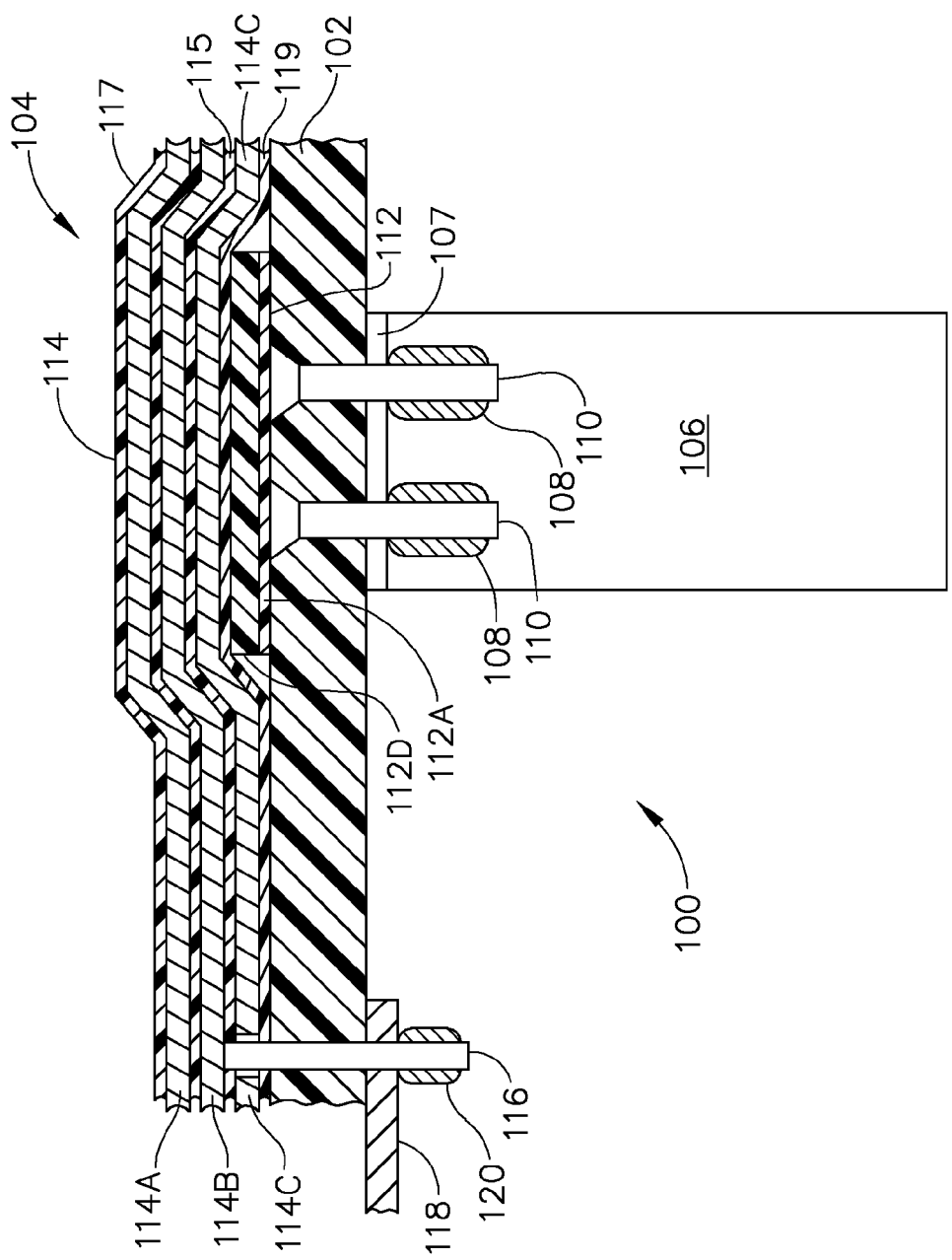
FIG. 1 is a cross section of an exemplary multiple functionality appliqué incorporating the elements of the present invention.

The disclosure of parent application Ser. No. 11/277,888, previously referenced, is incorporated herein as though fully set forth. An example of a lightning protection system according to an advantageous embodiment of the present invention is shown in FIG. 1 in a cross section 100 of an aircraft wing section. In this example, the cross section is taken through a composite skin 102, e.g., a Carbon Fiber Reinforced Plastic (CFRP) skin, of the aircraft wing, protected by an exemplary embodiment of a Flex-Circuit Lightning Protection Appliqué (FCLPA) 104. Thicknesses of the FCLPA are exaggerated for clarity. The composite skin 102 is fastened to a rib (metal or CFRP) 106 or similarly to a spar, by metallic skin fasteners 108 extending through the skin and shear tie flange 107, held in place by metallic collars or nuts 110. In this example, the cross section is part of a fuel tank housed in the wing section. Although shown in this example as protecting skin fasteners at a wing fuel tank, this is only one exemplary embodiment. FCLPA 104 is applicable for use in protecting any composite structure surface area where metal is exposed at the skin surface and thereby exposed to similar lightning threat levels, including other areas of a composite aircraft. For the embodiment shown, the lightning protection appliqué 102 includes a dielectric ply 112 electrically isolating and insulating skin fasteners 108 from a lightning strike, and multiple conductive plies 114A, 114B and 114C. The multi-layered system of alternating conductor and isolator layers is specifically designed and fabricated to provide unique electrical routing functions in addition to lightning protection with each of the conductors having separate functions.

At least one of the conducting layers has conductive characteristics sufficient to divert electrical energy from such a lightning strike away from isolated skin fasteners 108. Further, the conductive ply having these desired conductive characteristics extends at least 1.0" (2.54 cm) beyond dielectric ply 112 at the skin fasteners 108, in this example to a ground contact 116, e.g., a bolt or rivet that is separated from skin fasteners 108 and located away from the fuel tank. The ground contact 116 is connected to a platform ground 118 and held in place by a nut 120 or other suitable attachment. Alternately, the conductive ply employed for lightning current dissipation is selected large enough that the lightning strike current dispersed around the surface of the structure to what are non-critical areas and without connecting the conductive ply 114 to platform ground 118. In an exemplary embodiment, the conductive layer may be connected to the leading/trailing edge interface segments outside the composite wing box fuel tank.

The dielectric ply 112 may be, for example, a suitable electrically insulating or dielectric film 112D of an appropriate thickness, e.g., 0.003" to 0.010" (0.076-0.254 mm) and an attachment backing 112A. In exemplary embodiments, a pressure sensitive adhesive approximately 0.002" (0.050 mm) thick is employed. The specific material selected for electrically insulating dielectric film 112D depends on the intended installation conditions and the system design. Fluoropolymer films such as for example polytetrafluoroethylene (PTFE); or a terpolymer of tetrafluoroethylene, hexafluoropropylene, and vinylidene fluoride (THV); or fluorinated ethylene propylene (FEP); or perfluoroalkoxytetrafluoroethylene (PFA) are exemplary choices for the dielectric layer in various embodiments. For embodiments intended for applications in areas with lower lightning threat levels, the dielectric ply, as a discrete element is omitted. With the Flex Circuit Lightning Protection Appliqué design, the dielectric layer may be fully integrated into the flex circuit product form. For applications involving high lightning threat levels where thicker isolation is needed, the use of a separate dielectric layer 112 is still advisable.

Multiple conductive plies 114A-C in this example are separated by dielectric layers 115 to insulate the various conductors from one another to allow proper functionality. A protective surface layer 117 (for the embodiment shown an additional dielectric layer comparable to the internal separation layers) covers the outer conductive ply and an attachment backing 119 is employed to attach the multi-conductor flex circuit elements over protective dielectric ply 112.

In the exemplary embodiment, there is at least one conductive center layer 114B that provides the lightning protection function. For the exemplary embodiment, this conductive layer has a conductor pattern of 0.0007 inch thickness minimum in solid or mesh configuration. The conductor material is aluminum, copper or a derivative alloy. Placement of the lightning protection layer in various embodiments depends on the overall function of the flex circuit. If the flex circuit contains surface sensors/features, then those features are expected to be placed in layer 114A with the lightning protection layer being in layer 114B. However, if there are not surface sensors, then the lightning protection feature would be at layer 114A.

Protective surface layer 117 provides the FCLAP conductors with partial environmental protection and promotes primer/top coat adhesion for subsequent painting, if necessary. In the exemplary embodiment, the protective surface layer is a 0.0005" to 0.005" (0.013-0.13 mm) thick electrically insulating film, employing the same material as electrically insulating film employed for dielectric layers 115 placed alternately in between conductive plies 114A-C. Attachment backing 119 is a layer of pressure sensitive adhesive, typically 0.002" thick (0.051 mm) thick. A sealant may be applied along the edges of the plies 112, 114, to prevent chemical/environmental erosion.

The dielectric ply 112 is applied in a strip to the skin 102 covering all skin fasteners 108 in the area of exposure. If applicable, the dielectric ply 112 also covers any other exposed surface metal features. The overlap distance that the dielectric layer strip 112 must overlap surface metal depends on the skin resistance and the level of desired protection. However, for a state of the art CFRP and for a one hundred kiloampere (100 kA) lightning strike, the overlap is at least 1.8" (4.57 cm) to sufficiently isolate metallic surface features.

The flex circuit containing conductive plies 114A-C has significantly greater area coverage than dielectric layer strip 112 at least for the ply specific to lightning protection and is applied directly over the dielectric layer strip and CFRP skin 102. In certain embodiments, the dielectric layer strip is incorporated directly into the flex circuit. Conductive ply 114B provides a high current path to the platform ground 118 that directs current from lightning strikes away from the isolated skin fasteners 108 and through grounding studs 116 and nuts 120. The grounding studs 116 are strategically located outside the critical areas to allow current to safely transition from the conductive layer 114B. The much lower resistance of conductive ply 114B assures that very little current, if any, flows through the isolated skin fasteners 108. Substantially all of the effects of a lightning strike are directed well away the critical wing box section and so, away from the fuel tank. Accordingly, a preferred lightning protection appliqué 104 is capable of successfully meeting the lightning protection requirements for lightning strike zone 2 (100 kA) as set forth in SAE International standard No. ARP5412.

Figure 2B:
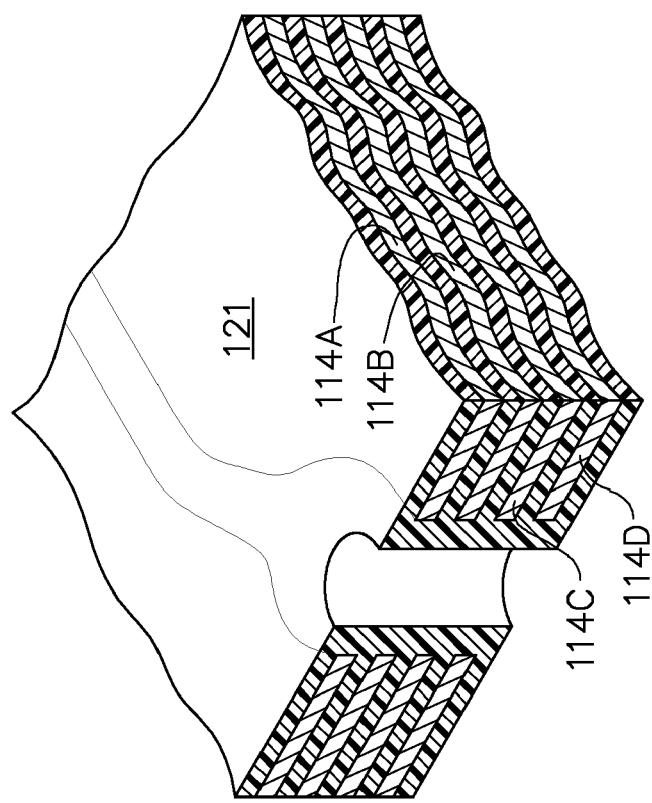
FIG. 2b is a cross sectional profile view of an appliqué according to the present invention having 4 conductive layers.
Figure 2A:
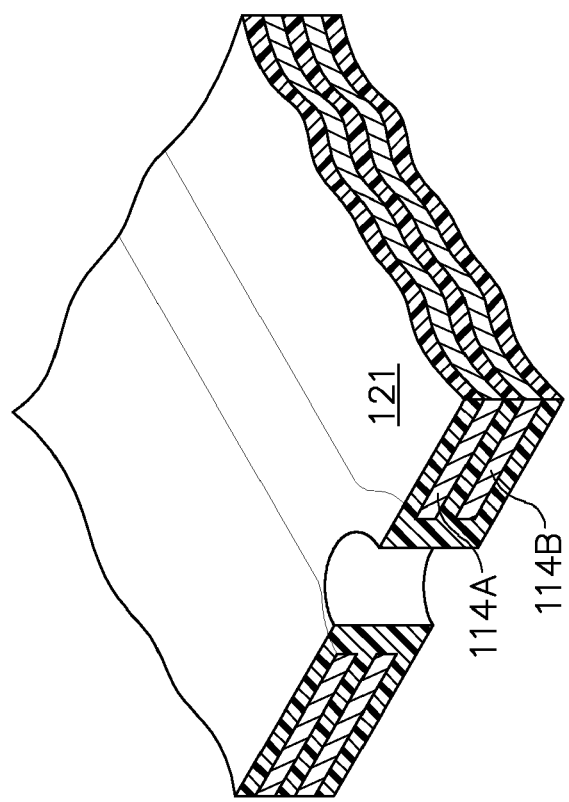
FIG. 2a is a cross sectional profile view of an appliqué according to the present invention having two conductive layers.

FIGS. 2a and 2b show exemplary flex circuit multilayer systems applicable to the present invention with FIG. 2a demonstrating a 2 conductor device (incorporating only two of the exemplary conductor elements 114A and 114B) with FIG. 2b demonstrating a 4 conductor device (including 4$^{th}$ conductor element 114D). Depending of the complexity of the intended function, the flex circuit conductive layer may contain up to 16 layers. The lightning protection layer in the flex circuit is provided in alternative embodiments with the added current routing function by etching/patterning of the conductor material (e.g., copper). Vias 121 in the Flex Conductor element are plated through or selectively insulated from conductors to achieve desired functionality. For example, connection through the Flex Conductor to grounding studs 116 as previously described with the studs extending through appropriately plated vias for connection to the lightning protection layer. Connection to alternative layers such as the deicing conductor for attachment to necessary circuit connections is similarly accomplished.

Figure 3:
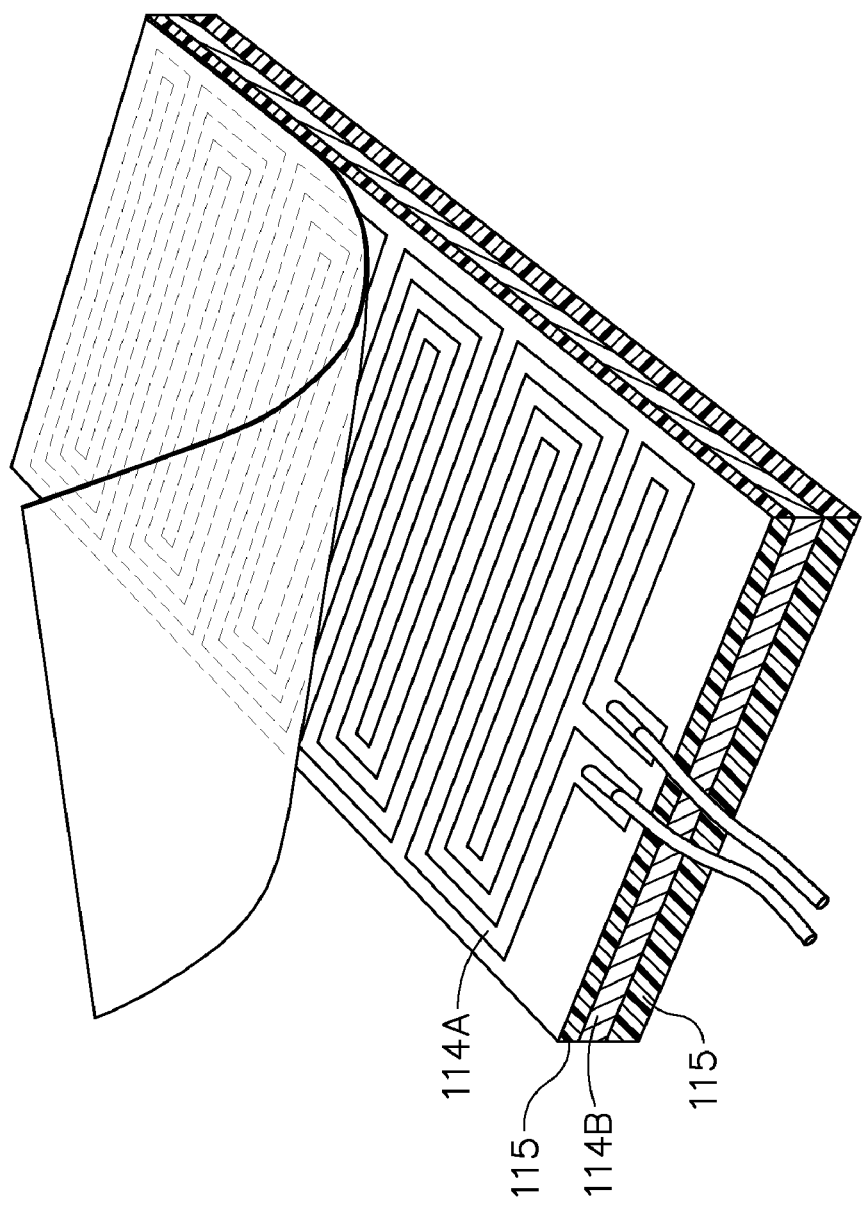
FIG. 3 is a peeled sectional view of an appliqué according to the present invention incorporating a deicing heating element as an outer layer of the flex circuit; and, FIG. 4 is an exemplary diagram of an application of the inventive system to an aircraft.

The additional layers provided by the Flex Circuit LPA allow addition of increased functionality. For example, for a dual-purpose integrated de-icing and lightning protection appliqué system, supplementing a conductor layer (solid or patterned for current routing) for diversion of the lightning current at the surface with an additional layer of copper foil conductor, etched to form specific heating element patterns for specific sections of composite structures, provides for de-icing. FIG. 3 shows an exemplary Flex Circuit employing two layers for this configuration. The etched heater element conductor layer 114A and the lightning protection conductor Layer 114B are isolated by dielectric layers 115 made of polyimide or Teflon that have been previously demonstrated as effective isolating materials in lightning protection systems. In this example, the high temperature characteristics of polyimide system, combined with the flexibility offered by thin, etched copper foil heating element and the already demonstrated lightning protection appliqué technology enable implementation of novel, dual-application lighting protection, de-icing system based on proven, mature technologies. While conductor 114A is described herein as a heating element for deicing, the etched copper foil element shown is applicable to complex antenna/sensor patterns. Similar applications are implemented for lightning protection appliqué system with health monitoring, communications and wiring capabilities in alternative embodiments.

Figure 4:
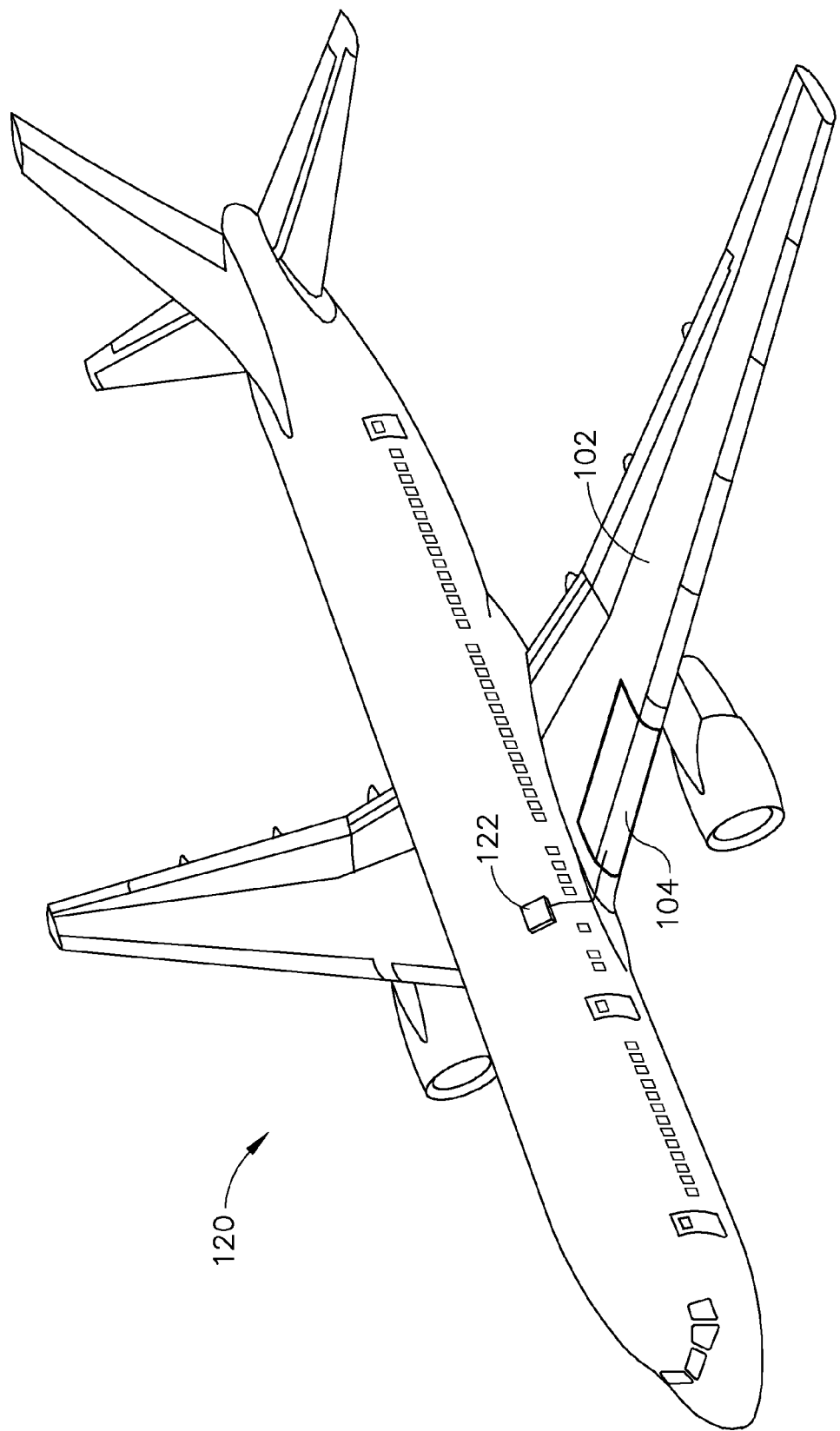

FIG. 4 shows an example of an aircraft 120 with an exemplary lightning protection appliqué comparable to the FCLPA 104 of FIG. 1 fixed to the skin 102 of the wing over metal features on the wing. As noted above, the metal features may be fasteners at the fuel tank. Moreover, since the preferred conductive ply provides this external high current path, it is unnecessary to add weight to the CFRP skin by including a conductive surface protection layer. Thus, the lightning protection appliqué, which contains the lightning discharge protection, avoids the substantial weight of including a conductive surface protection layer. In particular, the lightning protection appliqué may be applied post-assembly after fastener installation and is easily inspected, maintained and replaced as necessary. Further, for a selective implementation, the preferred lightning protection appliqué 104 may also be uniquely configured/designed to satisfy the Electromagnetic Effect (EME) requirements for a particular lightning zone. Generally, a higher expected lightning discharge carries a higher current level and requires greater conductor thickness. So, the dielectric layer (112D, 115 in FIG. 1) thicknesses and the lightning protection conductive element (114B in FIG. 1) thickness can be selected accordingly to satisfy the particular lightning protection requirement level of each particular lightning zone.

The example shown in FIG. 4 also includes the deicing element in the FCLPA which is interconnected with current source and controller 122 in the aircraft for providing actuation current to the deicing element.

Having now described exemplary embodiments of the invention as required by the patent statutes, those skilled in the art will recognize modifications and substitutions to the specific embodiments disclosed herein. Such modifications are within the scope and intent of the present invention as defined in the following claims.

What is claimed is:

1. A lightning protection system comprising:
   a plurality of flexible conductive plies integrated in a flex circuit appliqué to be adhesively affixed to a composite surface, at least a first one of said plies formed by etching of a conductor material having a conductive current routing function and thickness variation over particular zones sufficient to divert electrical energy from a lightning strike and at least a second one of said plies comprising operational circuitry; and
   a flexible dielectric ply fixed intermediate the conductive plies and the composite surface having partial coverage of the surface and selectively positioned over and completely covering selected metal surface features intermediate said plurality of conductive plies and said composite surface to isolate said metal surface feature from the at least one conductive ply of the appliqué having conductive characteristics sufficient to divert electrical energy from a lightning strike.

2. A lightning protection system as defined in claim 1 wherein each conductive ply incorporates an etched conductive layer and a dielectric layer intermediate the conductive layer and an adjacent conductive ply.

3. A lightning protection system as defined in claim 1 wherein a bottom conductive ply incorporates an attachment backing layer for securing said plurality of conductive plies to the composite surface and the dielectric ply.

4. A lightning protection system as defined in claim 1 wherein said etched first one of said conductive plies is connected with plated vias to a platform ground.

5. A lightning protection system as defined in claim 1, wherein the conductive layer of said first one of said conductive plies comprises a minimum thickness 0.0007" (0.018 mm) metal conductor with thickness variation over particular zones.

6. A lightning protection system as defined in claim 1, wherein said dielectric ply comprises:
   a layer of dielectric film; and
   a pressure sensitive adhesive layer attaching said dielectric ply to said composite surface.

7. A lightning protection system as in claim 6, wherein said dielectric ply is a film of dielectric material selected from a group of materials consisting of a fluoropolymer, a polyester, a polyimide, and polyurethane.

8. A lightning protection system as defined in claim 2, wherein said dielectric layer in each said conductive ply is selected from a group of materials consisting of a fluoropolymer, a polyester, a polyimide, and polyurethane.

9. A lightning protection system as defined in claim 1, further comprising:
   a platform ground; and
   an external connection to said platform ground, said etched first one of said conductive plies contacting said external connection with plated vias, current from lightning strikes dispersing through said platform ground.

10. A lightning protection system as defined in claim 1 wherein the operational circuitry of said second one of said conductive plies is etched to form specific heating element patterns for specific sections of composite structures as a deicing heater element.

11. A lightning protection system as defined in claim 1 wherein the operational circuitry of said second one of said conductive plies is an antenna.

12. A lightning protection system as defined in claim 1 wherein the operational circuitry of said second one of said conductive plies is a sensor.

13. An aircraft lightning protection system comprising:
an appliqué having a plurality of flexible conductive plies adhesively affixed to a composite surface on an aircraft, at least a first one of said plies formed by etching of a conductor material having a conductive current routing function and thickness variation over particular zones sufficient to divert electrical energy from a lightning strike and at least a second one of said plies comprising operational circuitry etched in at least a second one of said conductive plies for electrical interconnection with aircraft systems;
an integral flexible dielectric ply fixed to the conductive plies intermediate conductive plies and the composite surface and selectively positioned over and completely covering selected metal surface features on the aircraft, said dielectric ply intermediate said plurality of conductive plies and said composite surface.

14. An aircraft lightning protection system as defined in claim 13 wherein each conductive ply incorporates an etched flexible conductive layer and a flexible dielectric layer intermediate the conductive layer and an adjacent conductive ply.

15. An aircraft lightning protection system as defined in claim 13 wherein a bottom conductive ply of the appliqué incorporates an attachment backing layer for securing said plurality of conductive plies to the composite surface and the dielectric ply.

16. An aircraft lightning protection system as defined in claim 13, wherein the flexible conductive layer of said first one of said conductive plies comprises a minimum thickness 0.0007" (0.018 mm) metal conductor with thickness variation over particular zones.

17. An aircraft lightning protection system as defined in claim 13, wherein said dielectric ply comprises:
a layer of dielectric film; and
a pressure sensitive adhesive layer attaching said layer of dielectric film to said composite surface.

18. An aircraft lightning protection system as in claim 17, wherein said dielectric ply is a film of dielectric material selected from a group of materials consisting of a fluoropolymer, a polyester, a polyimide, and polyurethane.

19. An aircraft lightning protection system as defined in claim 14, wherein said dielectric layer in each said conductive ply is selected from a group of materials consisting of a fluoropolymer, a polyester, a polyimide, and polyurethane.

20. An aircraft lightning protection system as defined in claim 13, further comprising:
a platform ground; and
an external connection to said platform ground, said etched first one of said conductive plies upon application of the appliqué contacting said external connection through plated vias to direct current from lightning strikes to disperse through said platform ground.

21. An aircraft lightning protection system as defined in claim 13 wherein the operational circuitry of said second one of said conductive plies is a deicing heater element.

22. An aircraft lightning protection system as defined in claim 13 wherein the operational circuitry of said second one of said conductive plies is an antenna.

23. An aircraft lightning protection system as defined in claim 13 wherein the operational circuitry of said second one of said conductive plies is a sensor.

24. A method for lightning protection of an aircraft comprising the steps of:
providing a dielectric ply;
fixing said dielectric ply to a composite surface with partial coverage over and completely covering selected metal surface features on the aircraft;
providing a flexible appliqué having a plurality of etched conductive plies, including
etching of a conductor material in at least a first one of said plies for a conductive current routing function and thickness variation over particular zones sufficient to divert electrical energy from a lightning strike to a ground contact not selectively covered by said dielectric ply;
providing plated vias for connection of said etched first one of said plies for connection to said ground contact; and
etching at least a second one of said conductive plies to form operational circuitry for electrical interconnection with aircraft systems;
adhesively affixing said appliqué to the composite surface of the aircraft completely covering said dielectric ply to isolate said at least one metal surface feature from the at least one conductive ply of the appliqué having conductive characteristics sufficient to divert electrical energy from a lightning strike;
connecting said second one of said conductive plies to an electrical system on the aircraft.

25. A method as defined in claim 24 wherein the step of providing and appliqué includes the steps of
assembling for each conductive ply in the appliqué a conductive layer and a dielectric layer intermediate the conductive layer and an adjacent conductive ply.

26. A method as defined in claim 24 wherein the step of adhesively affixing the appliqué further includes the steps of
providing an external connection to a platform ground through said ground contact not selectively covered by said dielectric ply; and
connecting said first one of said conductive plies through said plated vias to said external connection to direct current from lightning strikes to disperse through said platform ground.

27. A method as defined in claim 24 wherein the operational circuitry comprises a deicing heater element and the step of connecting said second one of said conductive plies comprises connecting a current source and control to said second one of the conductive plies for aircraft deicing.

* * * * *